United States Patent
Peleska

(10) Patent No.: US 6,236,549 B1
(45) Date of Patent: May 22, 2001

(54) CIRCUIT FOR PREVENTING MODULE DAMAGE IN INTEGRATED CIRCUITS WHICH REQUIRE A PLURALITY OF SUPPLY VOLTAGES

(75) Inventor: Pavel Peleska, Graefelfing (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/322,383

(22) Filed: May 28, 1999

(51) Int. Cl.$^7$ ........................................................ H02H 3/20
(52) U.S. Cl. ............................................. 361/91.6; 361/56
(58) Field of Search .................................. 361/91.1, 91.5, 361/91.6, 111, 56; 307/43, 80–81, 85–87

(56) References Cited

U.S. PATENT DOCUMENTS

| | | | |
|---|---|---|---|
| 4,110,775 | * | 8/1978 | Festa ...................................... 257/484 |
| 4,860,151 | * | 8/1989 | Hutcheon et al. ...................... 361/91 |
| 4,878,145 | * | 10/1989 | Lace ...................................... 361/118 |
| 5,245,499 | * | 9/1993 | Senes ...................................... 361/56 |
| 5,528,447 | | 6/1996 | McManus et al. . |
| 5,530,612 | * | 6/1996 | Maloney ................................. 361/56 |
| 5,539,334 | * | 7/1996 | Clapp, III et al. ...................... 326/68 |
| 5,610,791 | | 3/1997 | Voldman . |
| 5,654,858 | * | 8/1997 | Martin et al. .......................... 361/56 |
| 6,002,568 | * | 12/1999 | Ker et al. .............................. 361/111 |

FOREIGN PATENT DOCUMENTS 195 01 985 A1   7/1996 (DE) .

* cited by examiner

Primary Examiner—Michael J. Sherry
(74) Attorney, Agent, or Firm—Bell, Boyd & Lloyd LLC

(57) ABSTRACT

An electrical circuit, which accepts an integrated circuit, which is supplied with operating voltages of different levels, and in which, between the supply voltages at their regular level, there is a diode function which is poled in the block direction. Such diode function preferably includes a Schottky diode between the circuit's terminals for the supply voltages at their regular levels, wherein the diode protects the circuit when the nominally low supply voltage has a higher voltage than the nominally high supply voltage.

1 Claim, 1 Drawing Sheet

CIRCUIT FOR PREVENTING MODULE DAMAGE IN INTEGRATED CIRCUITS WHICH REQUIRE A PLURALITY OF SUPPLY VOLTAGES

BACKGROUND OF THE INVENTION

1. Field of the Invention

The present invention relates to a wiring arrangement for protecting a circuit that requires one high supply voltage and one low supply voltage against damage due to a failure to maintain the provided order in applying the supply voltages.

2. Description of the Prior Art

Modules which accept multiple integrated circuits (IC), such as modules provided for connection to the standardized PCI (Peripheral Components Interface) bus, require a 5 V supply voltage for the module core and a 3.3 V supply voltage for the IO (Input/Output) buffer, in order to generate the 3.3 V PCI level. However, ESD (Electro Static Discharge)protection diodes and parasitic diodes which are internal to the module are poled in a conductive direction, in case the core is powered with a smaller supply voltage than the IO buffer, wherein an excess current flows into the IO buffer pin. This can lead to damage or destruction of the IO buffer. There is, accordingly, a need for what is known in this technical field as power sequencing, i.e. the maintenance of a starting sequence, according to which first the high supply voltage and then the low supply voltage is switched in (3.3 V after 5 V). In data processing PCs, this starting sequence can be guaranteed since the 3.3 V supply voltage is typically generated from the 5 V supply voltage. In systems with separate supply voltage modules, however, such as those encountered in telecommunication technology, this typically is not the case. Furthermore, the redundancy concept is such that the two supply voltage modules form independent failure units. It is required that no module be permanently damaged if one of the supply voltage modules fails.

In a PC system, the lower supply voltage (3.3 V) is generated from the higher supply voltage (5 V) by an in-phase regulator or a switching controller. Thus, the case cannot arise wherein the higher supply voltage fails and the lower supply voltage remains.

Accordingly, the present invention is directed toward the problem of developing a circuit arrangement as described above so as to avoid damage to an integrated circuit, even given mutually independent power supply modules for the high supply voltage and the low supply voltage, without having to maintain a starting sequence.

SUMMARY OF THE INVENTION

The present invention saves the expense of having to repair damages which arise as a result of a failure to maintain the starting sequence. Accordingly, in an embodiment of the present invention, a circuit is provided for protecting an integrated circuit, which requires both a high operating voltage and a low operating voltage, against damage due to a failure to maintain a provided order in applying the high and low operating voltage, wherein the circuit includes: a terminal for the high operating voltage; a terminal for the low operating voltage; and a diode having a cathode and an anode, wherein the cathode is connected to the terminal for the high operating voltage and the anode is connected to the terminal for the low operating voltage.

In a further embodiment of the present invention, the diode is of the Schottky type. This allows for a substantially total unloading of the diodes contained in the integrated circuit in an operative state in which there is a higher voltage pending at the terminal for the low supply voltage than at the terminal for the high supply voltage.

Additional features and advantages of the present invention are described in, and will be apparent from, the Detailed Description of the Preferred Embodiments and the Drawing.

DESCRIPTION OF THE DRAWING

The sole FIGURE is a block diagram schematic of the circuit of the present invention.

DETAILED DESCRIPTION OF THE PREFERRED EMBODIMENTS

Figure 1:
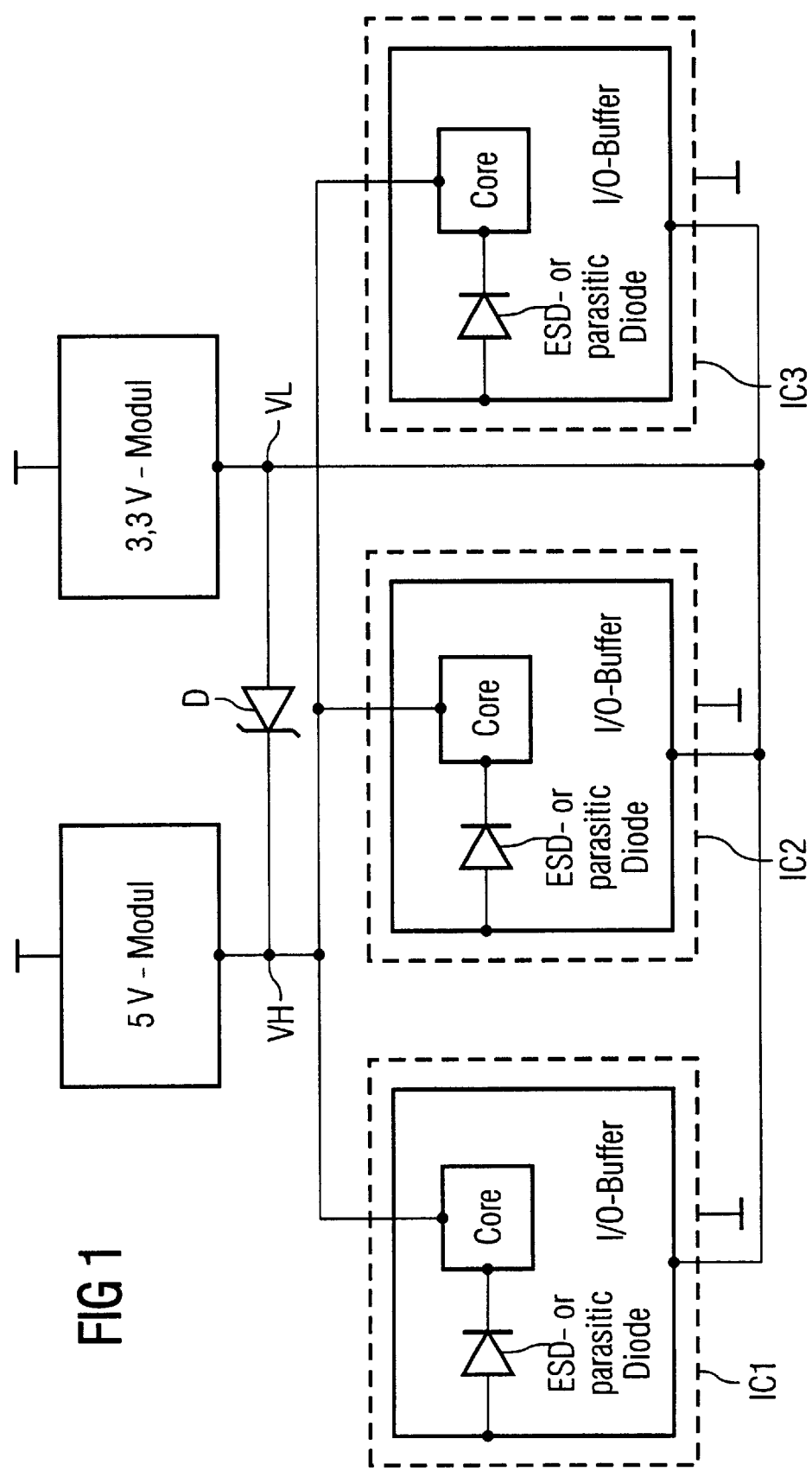

Multiple integrated circuits (IC1 . . . IC3) are shown in the FIGURE, each of which includes a module core which processes signals and which is supplied with an operating voltage by a high supply voltage VH (Voltage High). Each integrated circuit (IC1 . . . IC3) also includes a driver (also referred to as IO buffer), which routes signals via module terminals and is supplied with an operating voltage by a low supply voltage VL (Voltage Low).

The high supply voltage VH is made available by a 5 V module, and the low supply voltage VL is made available by a 3.3 V module. In addition, the modules and the integrated circuits (as referenced by a mass sign) are connected to the reference potential.

In each of the integrated circuits, between the terminal for the high supply voltage VH and the terminal for the low supply voltage VL, there is a diode which is connected to the terminal for the high supply voltage VH with its cathode and to the terminal for the low supply voltage VL with its anode. The diode function between the terminals stems from protective circuits for the protection against voltages outside a permitted area, also referred to as ESD protective circuits, or from parasitic diodes, such as those which arise in MOSFET transistors. The integrated circuits may be those which are provided for connection to the standardized PCI (Peripheral Components Interface) bus.

With respect to the present invention, it is essential that an electrical circuit is present which is supplied with operating voltage by a high supply voltage VH and a low supply voltage VL. According to the present invention, a diode D is inserted between the terminal for the high supply voltage VH and the terminal for the low supply voltage VL. The cathode of the diode D is connected to the terminal for the high supply voltage VH, and the anode of the diode D is connected to the terminal for the low supply voltage VL.

If an operative state arises in which there is a higher voltage pending at the terminal for the low supply voltage VL than at the terminal for the high supply voltage VH, a current flows via the diode D from the terminal for the low supply voltage VL to the terminal for the high supply voltage VH, thereby unloading the ESD diodes or the parasitic diodes in an integrated circuit.

A diode between the 3.3 V supply voltage circuit and the 5 V supply voltage circuit prevents the voltage in the 5V supply voltage circuit from dropping so low that the ESD protective diodes and the parasitic diodes internal to the module are poled in the conductive direction, thereby potentially damaging the IO buffer.

In a further embodiment of the present invention, the diode D is a diode of the Schottky type. The flow voltage $U_{VFSch}=0.3\ldots0.4$ V of the Schottky diode is lower than the flow voltage $U_{VF}=0.6\ldots0.7$V of the ESD diodes or the parasitic diodes of the integrated circuit. As such, in an operative state in which there is a lower voltage pending at the terminal for the high supply voltage VH than at the terminal for the low supply voltage VL, the ESD diodes or the parasitic diodes in the integrated circuit are completely unloaded.

Although the present invention has been described with reference to specific embodiments, those of skill in the art will recognize that changes may be made thereto without departing from the spirit and scope of the invention as set forth in the hereafter appended claims.

I claim as my invention:

1. A circuit for protecting an integrated circuit, which operates at both a high operating voltage and a low operating voltage upon observance of applying the high operating voltage first and then the low operating voltage, against damage due to non-observance of applying the high operating voltage first and then the low operating voltage, the circuit comprising:

a terminal for the high operating voltage;

a terminal for the low operating voltage; and a Schottky diode having a cathode and an anode, wherein the cathode is connected to the terminal for the high operating voltage and the anode is connected to the terminal for the low operating voltage outside of the integrated circuit.

* * * * *